United States Patent
Watkins et al.

(10) Patent No.: US 6,822,448 B2
(45) Date of Patent: *Nov. 23, 2004

(54) RF COIL FOR VERY HIGH FIELD MAGNETIC RESONANCE IMAGING

(75) Inventors: Ronald Dean Watkins, Niskayuna, NY (US); John Frederick Schenck, Voorheesville, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/839,940

(22) Filed: Apr. 20, 2001

(65) Prior Publication Data

US 2002/0153893 A1 Oct. 24, 2002

(51) Int. Cl.$^7$ ................................................. G01V 3/00
(52) U.S. Cl. ..................................................... 324/318
(58) Field of Search ................................. 324/307–309, 324/318, 322, 313–314, 303; 600/410, 422; 333/219, 230

(56) References Cited

U.S. PATENT DOCUMENTS

| | | | | |
|---|---|---|---|---|
| 4,680,548 A | * | 7/1987 | Edelstein et al. | 324/318 |
| 4,692,705 A | | 9/1987 | Hayes | 324/318 |
| 4,694,255 A | | 9/1987 | Hayes | 324/318 |
| 4,799,016 A | * | 1/1989 | Rezvani | 324/318 |
| 4,871,969 A | | 10/1989 | Roemer et al. | 324/318 |
| 4,879,515 A | | 11/1989 | Roemer et al. | 324/318 |
| 4,885,539 A | | 12/1989 | Roemer et al. | 324/318 |
| 4,887,039 A | | 12/1989 | Roemer et al. | 324/322 |
| 5,017,872 A | | 5/1991 | Foo et al. | 324/322 |
| 5,196,797 A | * | 3/1993 | Tropp | 324/322 |
| 5,474,069 A | * | 12/1995 | Wong et al. | 600/422 |
| 5,530,353 A | * | 6/1996 | Blanz | 324/315 |
| 5,619,996 A | * | 4/1997 | Beresten | 600/422 |
| 5,642,048 A | * | 6/1997 | Crozier et al. | 324/318 |
| 5,680,046 A | | 10/1997 | Frederick et al. | 324/318 |
| 5,760,583 A | | 6/1998 | Sato et al. | 324/318 |
| 5,990,681 A | * | 11/1999 | Richard et al. | 324/318 |
| 5,999,000 A | * | 12/1999 | Srinivasan | 324/318 |
| 6,043,658 A | * | 3/2000 | Leussier | 324/318 |
| 6,118,274 A | * | 9/2000 | Roffmann et al. | 324/321 |
| 6,150,816 A | * | 11/2000 | Srinivasan | 324/318 |
| 6,169,401 B1 | * | 1/2001 | Fujita et al. | 324/318 |
| 6,232,548 B1 | * | 5/2001 | Eberler et al. | 174/35 R |
| 6,285,189 B1 | * | 9/2001 | Wong | 324/318 |
| 6,437,568 B1 | * | 8/2002 | Edelstein et al. | 324/318 |
| 6,538,441 B1 | * | 3/2003 | Watkins et al. | 324/318 |
| 6,608,480 B1 | * | 8/2003 | Weyers | 324/318 |

OTHER PUBLICATIONS

Bushong, Stewart; "Magnetic Resonance Imaging", Second Edition; Mosby–Year Book, Inc.; 1996; pp. 137–138.*

* cited by examiner

Primary Examiner—Diego Gutierrez
Assistant Examiner—Dixomara Vargas
(74) Attorney, Agent, or Firm—Fletcher Yoder

(57) ABSTRACT

A radio frequency (RF) coil assembly for a very high field Magnetic Resonance Imaging (MRI) system is provided comprising a plurality of conductors arranged cylindrically and disposed about a cylindrical patient bore tube of the MRI system and a plurality of capacitive elements for electrically interconnecting the plurality of conductors at respective ends of the conductors. The conductors have a width selected for the RF coil assembly to resonate at substantially high frequencies. A very high field Magnetic Resonance Imaging (MRI) system is provided that comprises a RF coil assembly adapted to resonate at substantially high frequencies, a RF coil shield assembly and a plurality of RF drive power cables.

20 Claims, 3 Drawing Sheets

RF COIL FOR VERY HIGH FIELD MAGNETIC RESONANCE IMAGING

BACKGROUND OF THE INVENTION

This invention relates to a Magnetic Resonance Imaging (MRI) apparatus. More particularly, this invention relates to radio frequency (RF) coils useful with such apparatus for transmitting and/or receiving RF signals.

MRI scanners, which are used in various fields such as medical diagnostics, typically use a computer to create images based on the operation of a magnet, a gradient coil assembly, and a radiofrequency coil(s). The magnet creates a uniform main magnetic field that makes nuclei, such as hydrogen atomic nuclei, responsive to radiofrequency excitation. The gradient coil assembly imposes a series of pulsed, spatial-gradient magnetic fields upon the main magnetic field to give each point in the imaging volume a spatial identity corresponding to its unique set of magnetic fields during the imaging pulse sequence. The radiofrequency coil(s) creates an excitation frequency pulse that temporarily creates an oscillating transverse magnetization that is detected by the radiofrequency coil and used by the computer to create the image.

Generally, very high field strength is characterized as greater than 2 Tesla (2 T). In recent years, there has been an increase in usage of MRI systems at field strengths above the typical 1.5 Tesla. Research systems have been built as high as 8 Tesla. Systems are now commercially available at 3 Tesla and 4 Tesla. The systems are primarily used for research in function MRI (fMRI) and human head related imaging and spectroscopy studies. Higher magnetic field strength imposes challenges on the RF coil, such as balancing inductance and capacitance at higher frequencies (greater than the typical 64 MHz). At very high magnetic fields, and therefore very high Larmor frequencies, standard birdcage coils with moderately narrow rung copper strips will have relatively high inductance requiring very low capacitor values in order to resonate the coil. This is problematic for a number of reasons. Firstly, high currents through small value capacitors will have very high voltage potential across them which can then have a local stray electric field that can dissipate RF power in the form of heat in an imaging subject. Alternatively, the stray electric field can dissipate RF power into lossy dielectrics such as a fiberglass bore tube structure of the MRI system, on which the RF coil is generally mounted. Secondly, a small value capacitor will have a higher interaction with and sensitivity to surrounding stray capacitance and can cause variability in the center frequency of the coil, as well as variability in the stability to resonate at the higher frequencies.

What is needed is a whole body RF coil for imaging other parts of the human body other than the head, as well as supporting the use of local receive only coils, that is effective at the high magnetic field strengths.

BRIEF SUMMARY OF THE INVENTION

In a first aspect, a radio frequency (RF) coil assembly for a very high field Magnetic Resonance Imaging (MRI) system is provided comprising a plurality of conductors arranged cylindrically about a cylindrical patient bore tube of the MRI system and a plurality of capacitive elements for electrically interconnecting the plurality of conductors at respective ends of the conductors. The conductors have a width selected for the RF coil assembly to resonate at substantially high frequencies.

In a second aspect, a very high field Magnetic Resonance Imaging (MRI) system is provided that comprises a RF coil assembly adapted to resonate at substantially high frequencies, a RF coil shield assembly and a plurality of RF drive power cables.

BRIEF DESCRIPTION OF THE DRAWINGS

The features and advantages of the present invention will become apparent from the following detailed description of the invention when read with the accompanying drawings in which.

DETAILED DESCRIPTION OF THE PREFERRED EMBODIMENT

Figure 1:
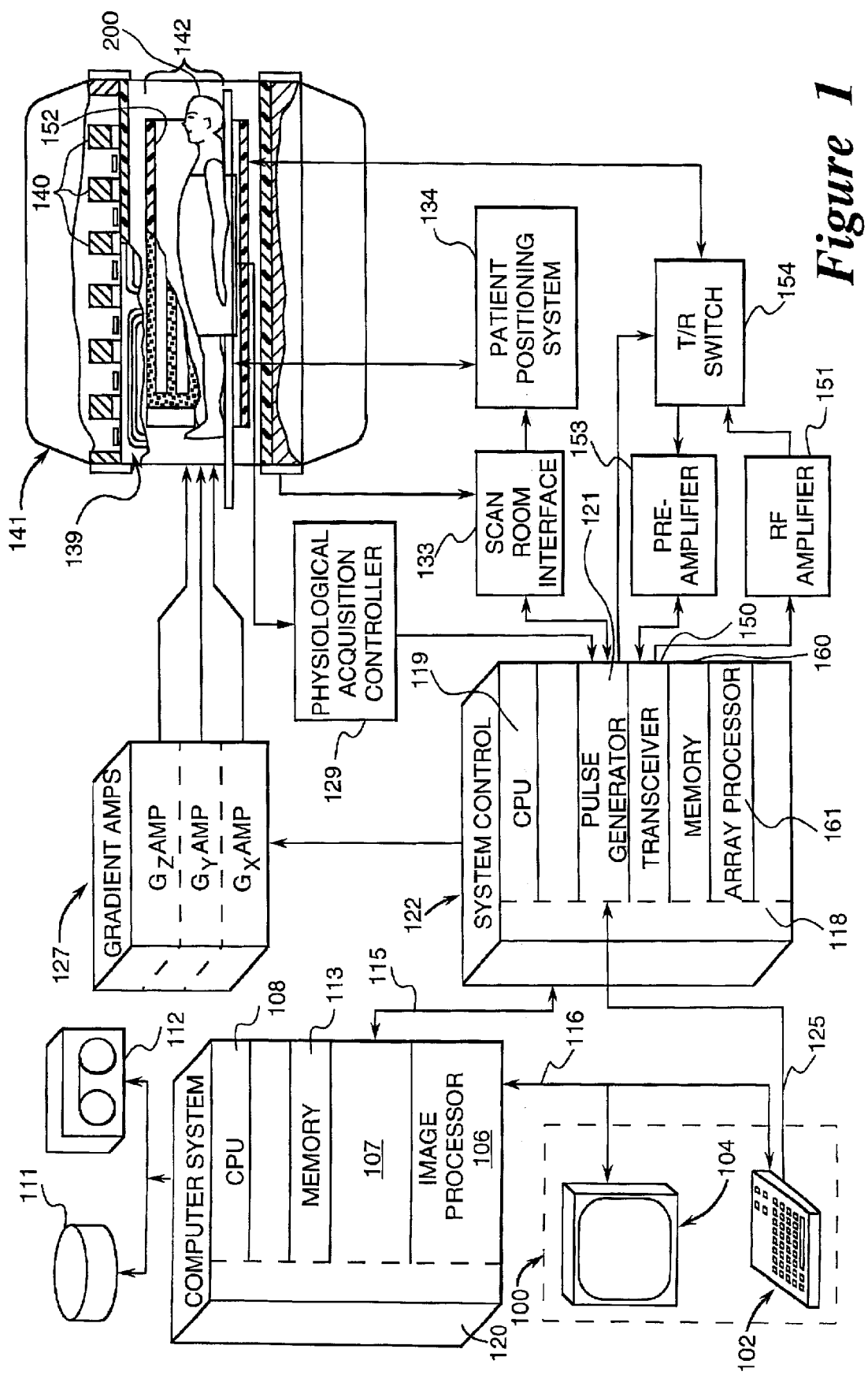
FIG. 1 illustrates a simplified block diagram of a Magnetic Resonance Imaging system to which embodiments of the present invention are useful.

FIG. 1 illustrates a simplified block diagram of a system for producing images in accordance with embodiments of the present invention. In an embodiment, the system is a MR imaging system which incorporates the present invention. The MRI system could be, for example, a GE-Signa MR scanner available from GE Medical Systems, Inc., which is adapted to perform the method of the present invention, although other systems could be used as well.

The operation of the MR system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108, and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data that indicate the timing, strength, and shape of the radio frequency (RF) pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives subject data from a physiological acquisition controller 129 that receives signals from a number of different sensors connected to the subject 200, such as ECG signals from electrodes or respiratory signals from a bellows. And finally, the pulse generator module 121 connects to a scan room interface circuit 133 which receives signals from various sensors associated with the condition of the subject 200 and the magnet system. It is also through the scan room interface circuit 133 that a positioning device 134 receives commands to move the subject 200 to the desired position for the scan.

The gradient waveforms produced by the pulse generator module 121 are applied to a gradient amplifier system 127 comprised of $G_x$, $G_y$, and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. Volume 142 is shown as the area within magnet assembly 141 for receiving subject 200 and includes a patient bore. As used herein, the usable volume of a MRI scanner is defined generally as the volume within volume 142 that is a contiguous area inside the patient bore where homogeneity of main, gradient and RF fields are within known, acceptable ranges for imaging. A transceiver module 150 in the system control 122 produces pulses that are amplified by an RF amplifier 151 and coupled to the RF coil 152 by a transmit/receive switch 154. The resulting signals radiated by the excited nuclei in the subject 200 may be sensed by the same RF coil 152 and coupled through the transmit/receive switch 154 to a preamplifier 153. The amplified MR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode. Embodiments of RF coil 152 will be discussed further with reference to FIG. 2. As used herein, "adapted to", "configured" and the like refer to mechanical or structural connections between elements to allow the elements to cooperate to provide a described effect; these terms also refer to operation capabilities of electrical elements such as analog or digital computers or application specific devices (such as an application specific integrated circuit (ASIC)) that is programmed to perform a sequel to provide an output in response to given input signals.

The MR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. These image data are conveyed through the serial link 115 to the computer system 107 where they are stored in the disk memory 111. In response to commands received from the operator console 100, these image data may be archived on the tape drive 112, or they may be further processed by the image processor 106 and conveyed to the operator console 100 and presented on the display 104. It is to be appreciated that a MRI scanner is designed to accomplish field homogeneity with given scanner requirements of openness, speed and cost.

As used herein, the term "very high field" refers to magnetic fields produced by the MRI system that are greater than about 2 Tesla. For embodiments of the invention the high field is desirably 3 Tesla. Also, as used herein, "very high frequency" is considered to be the range of about 64 MHz to about 500 MHz, with a desired range between about 128 MHz and 300 MHz. For embodiments of the invention, the high frequency is desirably at about 128 MHz. Imaging at very high fields and very high frequencies is particularly useful for cardiac, spine and extremity imaging.

Figure 2:
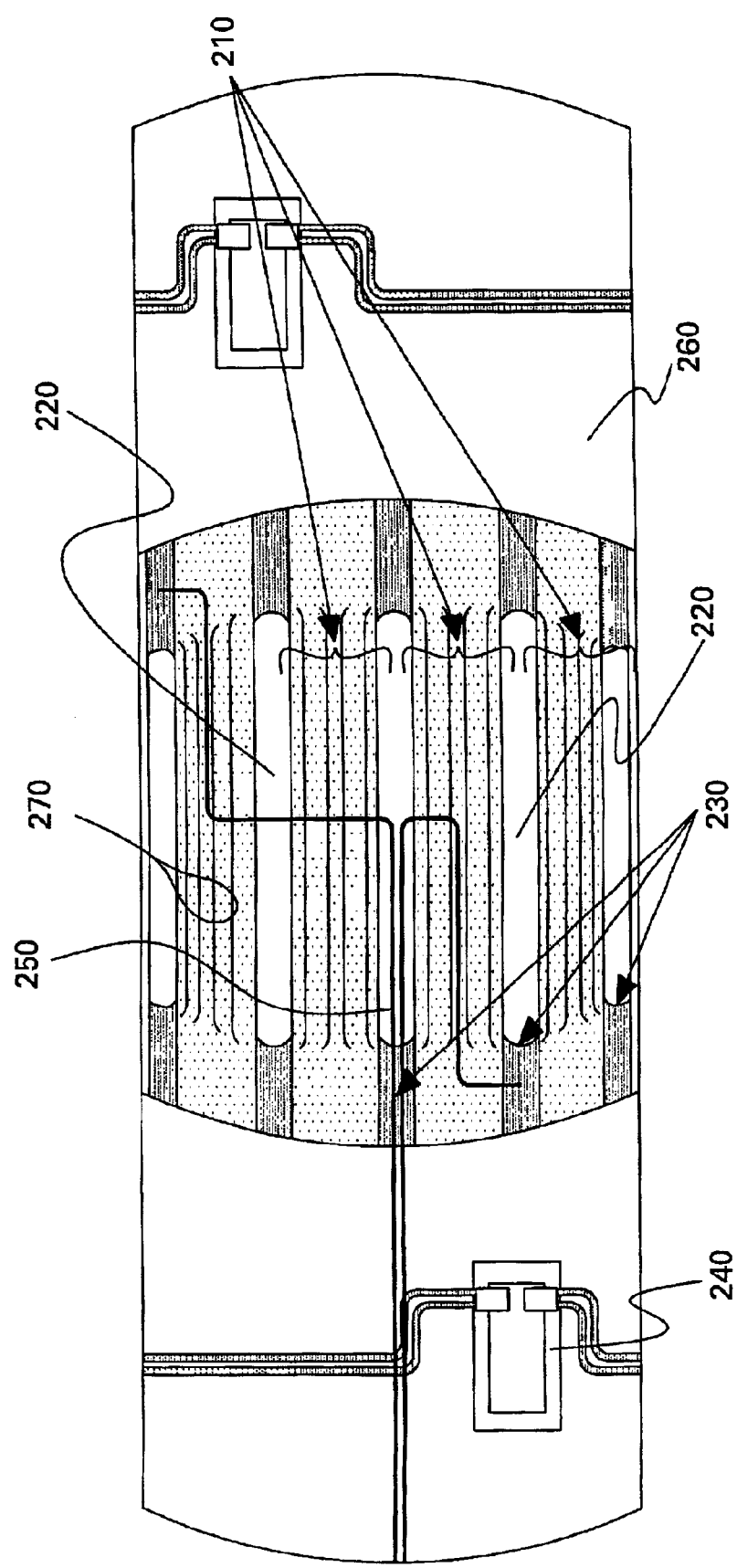
FIG. 2 is a schematic illustration of a radio frequency (RF) coil assembly to which embodiments of the present invention are applicable; and, FIG. 3 is a representative illustration of a RF coil shield assembly useful in embodiments of the present invention.

Referring to FIG. 2, an embodiment of a radio frequency (RF) coil assembly for a very high field MRI system is shown. In this embodiment, a RF coil assembly comprises a plurality of conductors 210 are arranged cylindrically and disposed about a cylindrical patient bore tube 260. The plurality of conductors define a cylindrical imaging volume into which a subject to be examined is subjected to a RF field produced by the coil. Conductors 210 are constructed from conventional materials such as copper or copper that is plated with silver or other metals known in the art. The thickness of conductors is selected in accordance with conventional thicknesses. The RF coil assembly further comprises a plurality of capacitive elements 230, such as low inductance end ring capacitors (loops), serially coupled to the conductors and for electrically interconnecting conductors 210 to one another at respective ends of conductors 210. Conductors 210 have a selected width to reduce inductance at substantially high frequencies. The selection of conductor width will be discussed in greater detail below. Disposed between the respective conductors 210 are gaps 220 that provide spacing between the conductors. The spacing is variable depending on the width of the conductors, which will be discussed further below. For purposes of the invention, the RF coil assembly comprises conductors 210, gaps 220 and capacitive elements 230, which will be described in greater detail below.

Referring further to FIG. 2, conductors 210 are shown as substantially identical segments cylindrically arranged, and longitudinally relative to one another, and disposed about patient bore tube 260. Patient bore tube 260 is of a type used in conventional MRI systems, and typically is constructed of fiberglass. Conductors 210 are electrically interconnected in adjacent pairs at each end of the respective conductor pairs by capacitive elements 230. Capacitive elements 230 are desirably low inductance end ring capacitors known in the art. The value of capacitive elements is selected based on known computations depending on the operating parameters of the desired frequency and magnetic field strength. The resulting assembly of conductors and capacitive elements is a conductive loop for producing the RF field used in the MRI system for imaging.

The length of conductors 210 is selected based upon the desired imaging application and power considerations. The power requirements are directly related to the length of the conductors—the shorter the conductor length, the lower the power requirements. Conversely, a longer conductor length enables a larger field of view (FOV). The maximum length of the conductors cannot exceed the length of the patient bore tube 260. It is to be appreciated that one skilled in the art would determine the length of conductors 210 in accordance with established computations to accomplish the desired imaging application and power requirements. Conductor length also contributes inductance. In an exemplary embodiment, conductor length was selected to be about 50 cm and patient bore tube was about 94 cm. Also, in an exemplary embodiment, the outer diameter of the patient tube was about 55.7 cm.

As is well-known, frequency f is a function of inductance L and capacitance C, and is commonly expressed as:

$$f = 1/2\pi\sqrt{LC}$$

In order for the RF coil assembly of the present invention to resonate at very high frequencies in very high field MRI systems, conductor width is desirably selected to be substantially wide (wider than conventional MRI systems operating at less than 2 Tesla) in order to minimize inherent inductance.

In an embodiment, the width of the conductors is selected according to the equation:

$$w_{max}=2\pi*A/N$$

where $w_{max}$ is the maximum width of conductors 210, A is the outer diameter radius of patient bore tube 260 and N is the number of conductors. As indicated by the above equation, the width of conductors 210 is dependent on the number of conductors. Desirably, the number of conductors is 16 to obtain acceptable high resolution images. However, it is to be appreciated that one skilled in the art knows that the number of conductors is selectable based on considerations such as image resolution, power requirements, and imaging speed.

The number of capacitive elements 230 is directly related to the number of conductors. As discussed above, capacitive elements 230 connect adjacent conductors 210 in pairs to electrically interconnect all of the conductors to form a conductive loop for producing the RF field in the MRI system. Thus, desirably for 16 conductors there are 32 capacitive elements.

Conductors 210 are spaced apart by gaps 220. As discussed above, the widths of gaps 220 is dependent on the widths of conductors 210. The respective widths of gaps 220 and conductors 210, as cylindrically arranged about the patient bore tube, will total the outer diameter of the patient bore tube.

In a further embodiment, conductors 210 further comprises segment slots 270 which are provided in a known manner to substantially eliminate eddy currents induced by gradient coils (139 of FIG. 1) of the MRI system.

In another embodiment, a very high field MRI system comprises a RF coil assembly adapted to resonate at substantially high frequencies, a RF coil shield assembly and a plurality of RF drive power cables. Referring further to FIG. 2, an embodiment of a MRI system comprises a RF coil assembly as described above, RF drive cables 250, dynamic disable circuits 240 and a RF coil shield assembly which will be discussed with reference to FIG. 3. Dynamic disable circuits 240 are employed to deresonate the RF coil assembly during head and/or surface coil operation, as required. One or more disable circuits 240, of a conventional pin-diode type, are employed. In an exemplary embodiment, 8 disable circuits were used. RF drive cables 250 are an arrangement of multiple coaxial cable connections adapted to electrically connect to the RF coil assembly at one of capacitive elements 230 without need for any isolation means, such as conventional RF baluns. An example of a RF drive cable useful in this embodiment is described by U.S. Pat. No. 4,887,039 to Roemer et al.

Figure 3:
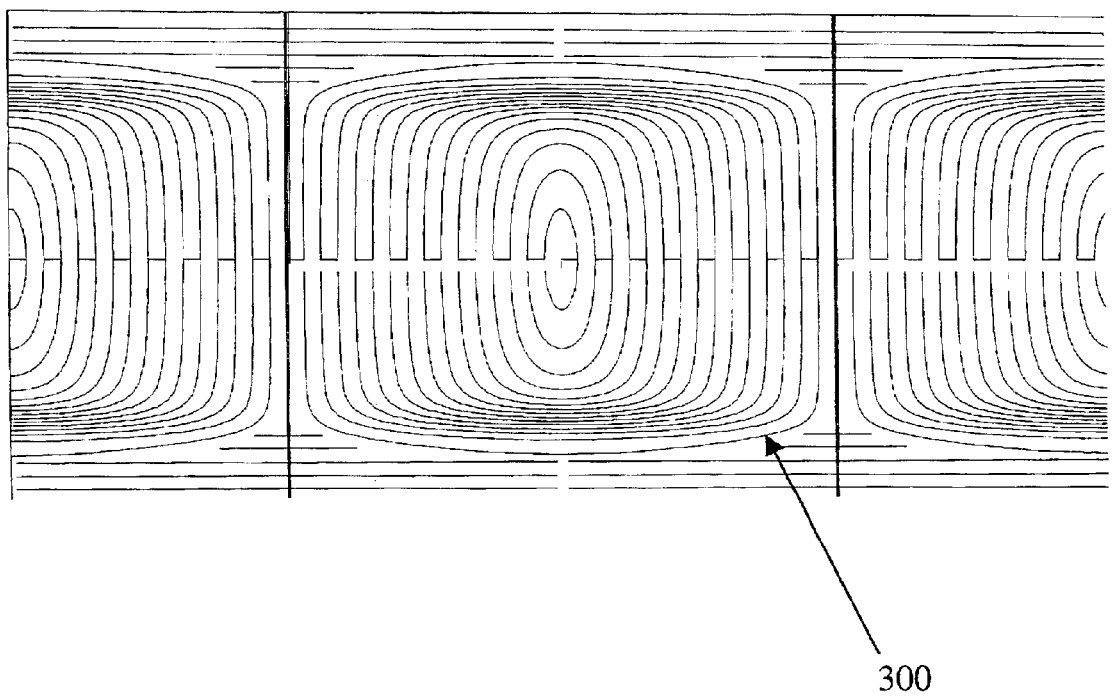

Referring to FIG. 3, a RF coil shield assembly is provided that is placed in close proximity to the RF coil assembly of FIG. 2. RF coil shield assembly 300, as shown in FIG. 3, is adapted to reduce the inductance of the conductors contained within the RF coil assembly. An example of a RF coil shield assembly useful in this embodiment is described by U.S. Pat. No. 4,871,969 to Roemer et al.

In an exemplary embodiment, a whole body shielded birdcage coil was designed for a 94 cm bore 3 Tesla magnet (e.g. Magnex Scientific 3T/94) fitted with GE Cardiac Resonance Module (CRM) gradient coils with a 60 cm inner diameter (I.D.). The birdcage coil is built on a 55 cm I.D. (55.7 cm outer diameter) fiberglass tube and has 16 conductors. The length of the conductors was 50 cm to reduce RF drive power and minimize conductor inductance. The conductors were also made very wide (7.9 cm with a gap of about 3 cm between conductors) to further reduce inductance and yield higher capacitor values. The birdcage antenna was built at 564 mm diameter inside a 600 mm segmented RF shield. This close shield spacing requires higher current to produce the $B_1$ but further reduced rung inductance yielding higher capacitor values of approximagely 40 pf. The coil has an unloaded Quality Factor (Q, reactance to resistance ratio) a of 236 and loaded Q of around 47. The RF coil assembly was connected to a 90 degree quadrature hybrid power splitter and driven by a 25 KW tube type RF amplifier (e.g., Astex Inc.). Pin diode disable circuits were employed in 8 locations for deresonating the coil during headcoil and receive surface coil operation.

The coil produced a $B_1$ field with a uniformity of +−10% over 20 cm diameter of spherical volume (DSV) and +−30% over 35 cm DSV as measured in air with a field probe. It was found that 12 KW of input RF power produced a 14.7 uT 180 degree pulse in 3.2 uSin a salt loader phantom. Load impedance varied between 40 and 80 ohms for various patient weights from 120 to 310 lbs. Images of the spine, heart, wrist, and abdomen were acquired with good results. The coil has an inherent efficiency of aproximately 75%.

The embodiment discussed above is a high pass RF coil assembly. Further embodiments include a band pass RF coil assembly and a low pass RF coil assembly. In a band pass RF coil assembly, conductors 210 are adapted to include capacitors, such as capacitive elements 220 of FIG. 2. Capacitive elements are also used as discussed above to electrically interconnect the conductors to form the RF coil assembly. A band pass configuration is desirably suitable in frequency ranges greater than about 200 MHz. A low pass embodiment comprises no end ring capacitive elements and conductors 210 are adapted to be constructed of capacitive elements.

It is to be appreciated that whole body RF coil assembly in a 3 T system will allow the use of virtually all whole body clinical application facilitated by a standard whole body 1.5 T system. Despite the aggressively short length of the coil, the limitation in FOV was primarily due to the Z gradient coil in the sagittal and coronal images. The peak and average power required to run standard image protocols although higher than 1.5 T systems is very reasonable and within current limits set by the FDA. 3 Tesla whole body systems provide a potential to have significant increase in image quality and resolution in high resolution applications such as cardiac, spine and extremity imaging.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A whole-body radio frequency (RF) coil assembly for a very high field Magnetic Resonance Imaging (MRI) system comprising:

a plurality of conductors arranged cylindrically and disposed about a patient bore tube of the MRI system, said conductors of a selected conductor length and having a conductor width and spacing between conductors, selected for said RF coil assembly to resonate at substantially high frequencies and to minimize conductor inductance; and, a plurality of capacitive elements for electrically interconnecting said plurality of conductors at respective ends of said conductors;

wherein said conductors and capacitive elements form a conductive loop for producing an RF field in the MRI system for imaging.

2. The RF coil assembly of claim 1 wherein the width of the conductors is selected in accordance with:

$$w_{max} = 2\pi * A/N$$

where $w_{max}$ is the maximum width, A is the outer diameter radius of said patient bore tube and N is the number of said conductors.

3. The RF coil assembly of claim 2 wherein said width is about 7.9 cm, and said number of conductors is 16.

4. The RF coil assembly of claim 1 wherein said substantially high frequencies occurs in a range between about 64 MHz to about 500 MHz.

5. The RF coil assembly of claim 1 wherein said very high field MRI system produces a magnetic field of about 3 Tesla (3 T).

6. The RF coil assembly of claim 1 wherein said plurality of conductors have a selectable length.

7. The RF coil assembly of claim 6 wherein said selectable length is about 55 cm.

8. The RF coil assembly of claim 1 wherein said capacitive elements are low inductance end ring capacitors.

9. The RF coil assembly of claim 1 wherein said conductors further include segmented slots for reducing eddy currents induced by gradient coils of said MRI system.

10. The RF coil assembly of claim 1 further comprising a plurality of gaps disposed between said conductors.

11. A very high field Magnetic Resonance Imaging (MRI) system comprising:

a whole-body radio frequency (RF) coil assembly adapted to resonate at substantially high frequencies, the RF coil assembly having a plurality of conductors of selected length and selected width to minimize inductance, said RF coil assembly comprising:

a plurality of conductors arranged cylindrically and disposed about a patient bore tube of the MRI system, said conductors having a width selected for said RF coil assembly to resonate at substantially high frequencies; and, a plurality of capacitive elements for electrically interconnecting said plurality of conductors at respective ends of said conductors, wherein said conductors and capacitive elements form a conductive loop for producing an RF field in the MRI system for imaging;

a RF coil shield assembly adapted to further reduce the inductance of the conductors contained within the RF coil assembly; and, a RF drive cable assembly adapted to electrically connect to the RF coil assembly.

12. The MRI system of claim 11 wherein said substantially high frequencies occur in a range of about 64 MHz and about 500 MHz.

13. The MRI system of claim 11 wherein said very high field MRI system produces a magnetic field of about 3 Tesla (3 T).

14. The MRI system of claim 11 wherein said plurality of conductors and plurality of capacitive elements are adapted to form a band pass RF coil assembly configuration.

15. The MRI system of claim 11 wherein said plurality of conductors and plurality of capacitive elements are adapted to form a low pass RF coil assembly configuration.

16. The MRI system of claim 11 wherein said plurality of conductors and plurality of capacitive elements form a high pass RF coil assembly configuration.

17. A radio frequency (RF) coil assembly for a very high field Magnetic Resonance Imaging (MRI) system comprising:

a plurality of conductors arranged cylindrically and disposed about a patient bore tube of the MRI system, said conductors of a selected conductor length and having a conductor width and spacing between conductors, selected for said RF coil assembly to resonate at substantially high frequencies and to minimize conductor inductance; and, a plurality of capacitive elements for electrically interconnecting said plurality of conductors at respective ends of said conductors, wherein the width of the conductors is selected in accordance with:

$$w_{max} = 2\pi * A/N$$

where wmax is the maximum width, A is the outer diameter radius of said patient bore tube and N is the number of said conductors.

18. The RF coil assembly of claim 17 further comprising a RF coil shield assembly adapted to further reduce the inductance of the conductors contained within the RF coil assembly.

19. The RF coil assembly of claim 17 wherein said width is about 7.9 cm, and said number of conductors is 16.

20. The RF coil assembly of claim 17 wherein said plurality of conductors have a selectable length, and wherein said selectable length is about 55 cm.

* * * * *